United States Patent
Kim et al.

(10) Patent No.: US 10,371,869 B2
(45) Date of Patent: *Aug. 6, 2019

(54) ANTI-SCRATCH FILM FOR FLEXIBLE DISPLAY

(71) Applicant: SAMSUNG DISPLAY CO., LTD., Yongin-si, Gyeonggi-do (KR)

(72) Inventors: Tae-Woong Kim, Yongin-si (KR); Hyun-Woo Koo, Yongin-si (KR); Young-Gug Seol, Yongin-si (KR); Patrick Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

This patent is subject to a terminal disclaimer.

(21) Appl. No.: 15/422,893

(22) Filed: Feb. 2, 2017

(65) Prior Publication Data
US 2017/0146697 A1     May 25, 2017

Related U.S. Application Data

(63) Continuation of application No. 14/011,732, filed on Aug. 27, 2013, now Pat. No. 9,594,190.

(30) Foreign Application Priority Data
Nov. 29, 2012   (KR) .................. 10-2012-0136844

(51) Int. Cl.
G02F 1/1343   (2006.01)
G02B 1/14   (2015.01)
(Continued)

(52) U.S. Cl.
CPC ............. *G02B 1/14* (2015.01); *G02B 1/10* (2013.01); *G02B 1/105* (2013.01);
(Continued)

(58) Field of Classification Search
None
See application file for complete search history.

(56) References Cited

U.S. PATENT DOCUMENTS

| 4,368,245 A | 1/1983 | Bayer |
| 5,492,769 A * | 2/1996 | Pryor ................. B05D 5/02 428/552 |

(Continued)

FOREIGN PATENT DOCUMENTS

| KR | 10-2004-0047998 | 6/2004 |
| KR | 10-2005-0116844 | 12/2005 |

(Continued)

OTHER PUBLICATIONS

Hsu, P.I., et al., Spherical Deformation of Compliant Substrates with Semiconductor Device Islands, Journal of Applied Physics, vol. 95, No. 2, Jan. 15, 2004, pp. 705-712.

(Continued)

*Primary Examiner* — Phu Vu
(74) *Attorney, Agent, or Firm* — Lewis Roca Rothgerber Christie LLP

(57) ABSTRACT

An anti-scratch film, including a film base and an anti-scratch layer on one side of the film base. The anti-scratch layer includes a plurality of protrusions.

16 Claims, 6 Drawing Sheets

(51) Int. Cl.
*G02B 1/10* (2015.01)
*H01L 51/52* (2006.01)

(52) U.S. Cl.
CPC .... *G02F 1/134309* (2013.01); *H01L 51/5253* (2013.01); *G02F 2201/50* (2013.01); *Y10T 428/24612* (2015.01)

(56) References Cited

U.S. PATENT DOCUMENTS

| | | | |
|---|---|---|---|
| 5,958,542 | A | 9/1999 | Ootake et al. |
| 9,594,190 | B2 * | 3/2017 | Kim ................ G02B 1/105 |
| 2002/0132491 | A1 | 9/2002 | Lang |
| 2004/0141121 | A1 | 7/2004 | Tanaka et al. |
| 2004/0191478 | A1 | 9/2004 | Nishikawa et al. |
| 2006/0233972 | A1 | 10/2006 | Muramatsu et al. |
| 2007/0096642 | A1 | 5/2007 | Lee et al. |
| 2009/0066885 | A1 | 3/2009 | Kumai |
| 2009/0246439 | A1 | 10/2009 | Kanno |
| 2009/0284686 | A1 | 11/2009 | Joo et al. |
| 2010/0013786 | A1 * | 1/2010 | Nishikawa ............ G06F 1/1624 345/173 |
| 2010/0188754 | A1 | 7/2010 | Gehlsen et al. |
| 2011/0025594 | A1 | 2/2011 | Watanabe |
| 2011/0227084 | A1 | 9/2011 | Giesbers et al. |
| 2012/0106063 | A1 | 5/2012 | Mathew et al. |
| 2014/0055717 | A1 | 2/2014 | Benson et al. |
| 2014/0078582 | A1 | 3/2014 | Cho |

FOREIGN PATENT DOCUMENTS

| | | |
|---|---|---|
| KR | 10-2010-0061356 | 6/2010 |
| KR | 10-2011-0061843 | 6/2011 |
| KR | 10-2012-0003322 | 1/2012 |
| KR | 10-2012-0012449 | 2/2012 |
| WO | WO 2012102690 A1 | 8/2012 |

OTHER PUBLICATIONS

KIPO Office action dated Mar. 28, 2014, for Korean priority Patent application 10-2012-0136844, (6 pages).
Chi et al. Optical film having anti-scratch characteristics for enhanced brightness, Machine translation of KR 2012-0012449 a from KIPO website, All pages.

* cited by examiner

ANTI-SCRATCH FILM FOR FLEXIBLE DISPLAY

CROSS-REFERENCE TO RELATED APPLICATION

This application is a continuation of U.S. patent application Ser. No. 14/011,732, filed Aug. 27, 2013, which claims priority to and the benefit of Korean Patent Application No. 10-2012-0136844, filed on Nov. 29, 2012 in the Korean Intellectual Property Office, the entire contents of which are incorporated herein by reference.

TECHNICAL FIELD

The present disclosure relates to a functional film for a display, and more particularly, to an anti-scratch film for a flexible display.

BACKGROUND

With the development of an information-oriented society, research on flat panel displays has gradually increased according to various demands. The flat panel displays include a plasma display panel (PDP), a liquid crystal display (LCD), and an organic light emitting display (OLED). In particular, OLEDs receive attention as a next-generation display device because of features such as a light weight, a thin structure, and low power consumption, but the LCD is widely used currently because of features such as a large area and a long lifespan.

Recently, a flexible display device that implements the various flat panel displays on a substrate made of a flexible material has received attention. There are advantages in that the flexible display device is thin and light, and can be bent or curved so as to be manufactured in various forms, and as a result, currently, the flexible display device is estimated as a next-generation technology in a flat panel display market.

A flat panel display has a structure in which a separate anti-scratch layer is interposed at the outermost side of the display device, in order to prevent the display from being damaged due to external contact.

FIG. 1 shows a diagram illustrating a configuration of an anti-scratch film 10 in the related art. The anti-scratch film in the related art may include a film base 11 and an anti-scratch layer 20 on the film base 11.

The anti-scratch layer 20 may be formed by coating a material having high hardness such as silicon oxide ($SiO_x$) or glass on the film base 11.

The anti-scratch layer 20 serves to protect the display device from external contact such as a touch input pen or a human hand.

Since the anti-scratch layer 20 has high hardness, the anti-scratch layer 20 has an advantage of protecting the display device from external contact, but since the anti-scratch layer 20 has a brittle characteristic when bent, the anti-scratch layer 20 is not typically used for a display device having a bending characteristic such as the flexible display device

SUMMARY

Aspects of embodiments of the present disclosure are directed toward an effort to provide an anti-scratch film and a manufacturing method thereof capable of being used for a display device having a bending characteristic such as a flexible display device.

An embodiment of the present disclosure provides an anti-scratch film, including: a film base; and an anti-scratch layer on one side of the film base, in which the anti-scratch layer includes a plurality of protrusions.

The film base may be formed with a transparent material.

An adhesive layer may be further included on the other side of the film base.

The anti-scratch layer may include at least one of $AlO_x$, $SiO_x$, $SiN_x$, and SiON.

The shape of each protrusion of the plurality of protrusions may be any one of a lens shape, a pyramidal shape, a conical shape, a prismatic shape, or a cylindrical shape.

A height of each protrusion of the plurality of protrusions may be from 0.1 μm to 100 μm.

A diameter of each protrusion of the plurality of protrusions may be 10 μm to 1 mm, with a longest radius on the base side of the protrusion.

A distance between adjacent protrusions may be from 10 μm to 1 mm.

An embodiment of the present disclosure provides a method of manufacturing an anti-scratch film, including forming protrusions on one side of a film base.

The forming of the protrusions may include coating a material for forming the protrusions on one side of the film base; forming a photoresist pattern on the material for forming the protrusions; exposing and developing the material for forming the protrusions with the photoresist pattern; etching the material for forming the protrusions with the photoresist pattern; and removing the photoresist pattern.

The forming of the protrusions may include forming a mask pattern on one side of the film base; and depositing a material for forming the protrusions.

Yet another embodiment of the present disclosure provides a display device, including: a substrate; a display element layer on the substrate; an encapsulation layer on the display element layer; and an anti-scratch film on the encapsulation layer, in which the anti-scratch film comprises a film base and an anti-scratch layer comprising a plurality of protrusions on one side of the anti-scratch film.

The display element layer may include a first electrode; an active layer on the first electrode; and a second electrode on the active layer.

The active layer may be an organic emission layer.

The active layer may be a liquid crystal layer.

Since an anti-scratch layer according to some embodiments has a structure capable of dispersing bending stress which is applied to the anti-scratch layer while the flexible display device is bent, the anti-scratch layer can be used even for a display device having a bending characteristic such as the flexible display device.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
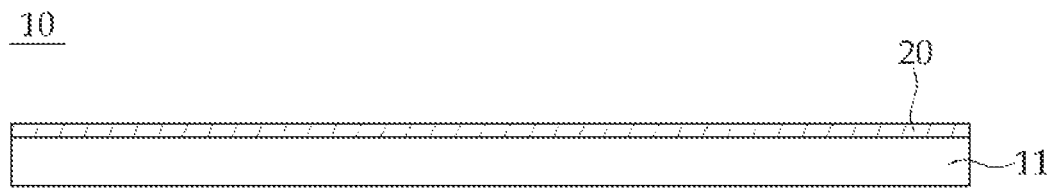
FIG. 1 shows a diagram illustrating a configuration of an anti-scratch film in the related art.

Hereinafter, embodiments of the present disclosure will be described in more detail with reference to the accompanying drawings.

Although the present disclosure can be modified in various ways and have several embodiments, specific embodiments are illustrated in the accompanying drawings and are described in the specification. However, the scope of the present disclosure is not limited to the specific embodiments described herein and should be construed as including all changes, equivalents, and substitutions included in the spirit and scope of the present disclosure.

In the specification, specific structural or functional descriptions are only exemplified to describe embodiments. The embodiments of the present disclosure can be implemented in various suitable forms, and thus the present disclosure is not limited to these embodiments. It should be understood that the present disclosure contains all changes, equivalents, and substitutions included in the spirit and the scope of the present disclosure.

It will be understood that when an element is simply referred to as being 'connected to' or 'contacted to' another element without being referred to as 'directly connected to' or 'directly contacted to' another element in the present disclosure, it may be 'directly connected to' or 'directly contacted to' another element or be connected to or coupled to another element, having the one or more other elements intervening therebetween.

When an element is referred to as being 'directly connected to' or 'directly contacted to' another element, another element intervening is not present therebetween. Other expressions describing the relationships among the elements, for example, 'between', 'directly between' or 'adjacent to' and 'directly adjacent to' may also be interpreted similarly.

Terms used in the specification are just used to describe illustrative embodiments and are not to be construed as limiting the present disclosure. A singular expression includes plural expressions as long as the expressions do not have an apparently different contextual meaning.

In this specification, terms such as 'comprise', 'include', or 'have' are used to designate presence of particular features, figures, steps, operations, elements, parts, or combinations thereof and it should be understood that additional features, figures, steps, operations, elements, parts, or combinations thereof, may also be included. Unless otherwise defined, all terms used herein, which include technical or scientific terms, have the same meanings as those generally appreciated by those skilled in the art. It should be understood that terms defined in advance, which are generally used have the same meanings as contextual meanings of associated techniques, if not explicitly defined in this application, the terms are not ideally or excessively analyzed as to their formal meanings.

Like reference numerals refer to like elements throughout the specification. Further, in the drawings, size and thickness of each element are schematically illustrated for convenience of description, and the present disclosure is not necessarily limited to those illustrated in the drawings.

In the drawings, the thicknesses of layers and regions are enlarged for clarity. In the drawings, the thicknesses of some layers and regions are exaggerated for convenience of description.

In this specification, the terms "film" or "films" may refer to layers, sheets, or plates having regular or substantially regular widths and thicknesses.

Figure 2:
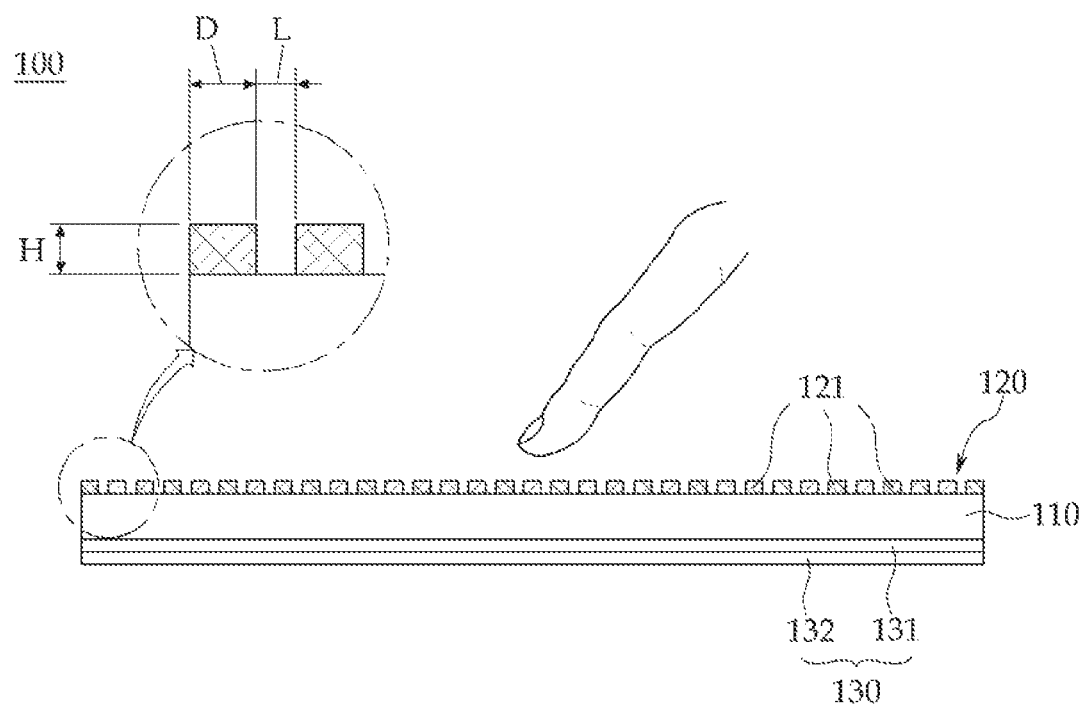
FIG. 2 shows a cross-sectional view illustrating an anti-scratch film according to an embodiment of the present disclosure.
Figure 3:
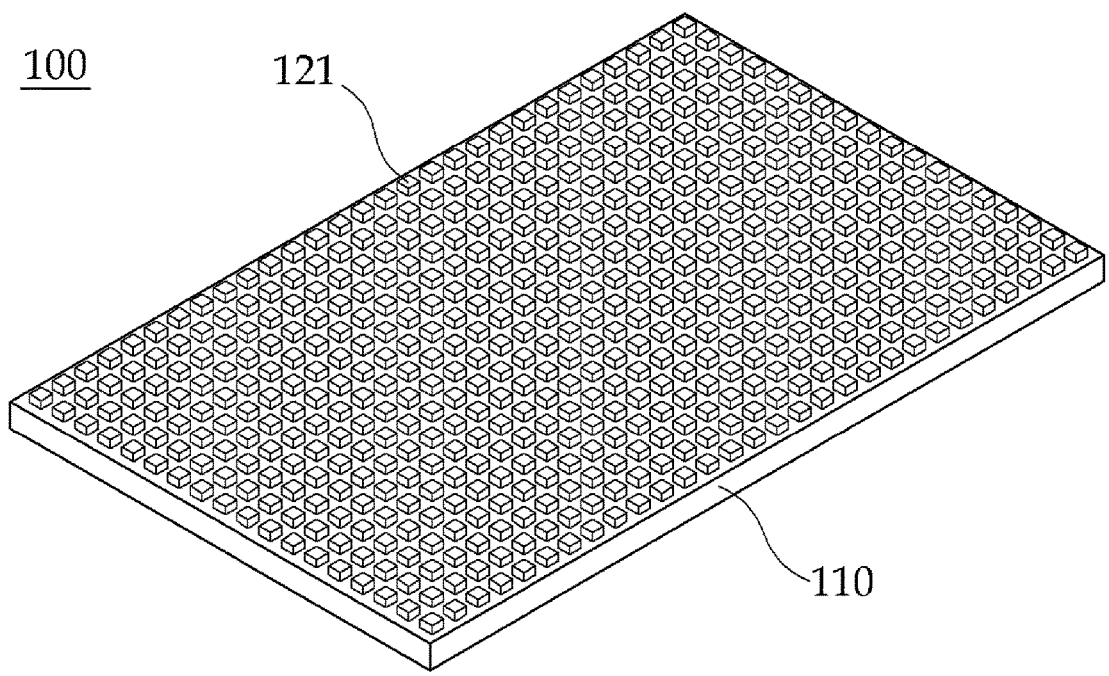
FIG. 3 shows a perspective view illustrating an anti-scratch film according to an embodiment of the present disclosure.

FIG. 2 shows a cross-sectional view illustrating an anti-scratch film according to an embodiment of the present disclosure. FIG. 3 shows a perspective view illustrating an anti-scratch film according to an embodiment of the present disclosure.

Referring to FIGS. 2 and 3, an anti-scratch film 100 according to an embodiment of the present disclosure may include a film base 110 having an anti-scratch layer 120 on one side of the film base. The anti-scratch layer 120 may include a plurality of protrusions 121.

The film base 110 may be made of a transparent material, but the material is not limited thereto and may be translucent or colored according to an optical requirement.

The film base 110 may be formed by using a flexible material. A thickness of the film base 110 is not particularly limited, but may be in the range of from 25 μm to 500 μm.

The film base 110 may use a film which is selected from known transparent material films, and it is not particularly limited. The transparent material films include, but are not limited to a polyester film, a polyethylene film, a polypropylene film, a tri-acetyl cellulose film, a polyvinyl chloride film, a polyvinyl alcohol film, a polyimide film, a cyclo-olefin resin film, a polycarbonate film, a polyethylene terephthalate film, a polyethylene naphthalate film, a polyether sulfone film, a polyimide film, an epoxy resin film, a phenol resin film, a melamine resin film, a polyurethane film, and/or an acrylic resin film.

The anti-scratch layer 120 may be formed on one side of the film base 110. The anti-scratch layer 120 may include the plurality of protrusions 121, and the plurality of protrusions 121 on the anti-scratch layer 120 may be separated from each other with island shapes.

A height H of each of the protrusions 121 may be from 0.1 μm to 100 μm, and a diameter D (with a longest radius on the base side of each of the protrusions 121, e.g. the protrusion 121 may get narrower toward the top) may be from 10 μm to 1 mm. Further, a distance L between adjacent protrusions 121 may be from 10 μm to 1 mm.

In an embodiment, the diameter D, with the longest radius on the base side of the protrusion 121, is formed with a set maximum size so that each protrusion 121 may be maintained in a flat or substantially flat state, even when the anti-scratch layer 120 is bent with a set radius of curvature.

In an embodiment, the distance L between the protrusions 121 is be maintained to have a smaller distance than a thickness of a touch input pen or a human nail, in order to protect the display device from external contact.

The height H and the size or diameter D of each of the protrusions 121, and the distance L between adjacent protrusions 121, may have set values according to the radius of curvature of the flexible display.

The plurality of protrusions 121 may contain at least one of aluminum oxide ($AlO_2$), aluminum nitride (AlN), aluminum oxynitride (AlON), silicon oxide ($SiO_2$), silicon nitride (SiN), and/or oxidized silicon nitride (SiON). In an embodiment, the protrusions 121 are formed with a material having a set minimum hardness, in order to protect the display device from external contact.

An adhesive layer 130 for attaching the film base 110 to the display device may be disposed on the other side of the film base 110. The other side of the film base 110 refers to a side of the film base 110 where the anti-scratch layer 120 is not formed, that is, a side of the film base 110 facing oppositely away from the side where the anti-scratch layer 120 is formed. The adhesive layer 130 may include an adhesive layer 131 and a releasing sheet 132.

The adhesive layer 131 may use an adhesive suitable for optical use (transparency), and the adhesive may use a urethane-based adhesive and/or a silicon-based adhesive. A thickness of the adhesive layer 131 may be in the range of from 10 μm to 60 μm.

The adhesive layer 130 may include a separate releasing sheet 132, for convenience of storage.

The anti-scratch film 100 according to an embodiment of the present disclosure may disperse stress applied to the anti-scratch layer 120 by forming the anti-scratch layer 120 with the plurality of protrusions 121 having island shapes as illustrated in FIG. 2.

Stress refers to a resistance or deforming force in a material generated when external force is applied to any material. The stress is continuously increased as the external force is increased, but since the material has a limit capable of resisting the stress, the material breaks when the material reaches a unique stress limit. That is, the larger the stress limit is, the stronger the material may be.

A magnitude of the stress may be represented by a magnitude of the external force applied per unit area, which is called a unit stress. Hereinafter, the term "stress" refers the unit stress unless otherwise noted.

Meanwhile, when a bending moment capable of bending the material is applied, the stress applied to the material is called "bending stress".

Figure 4A:
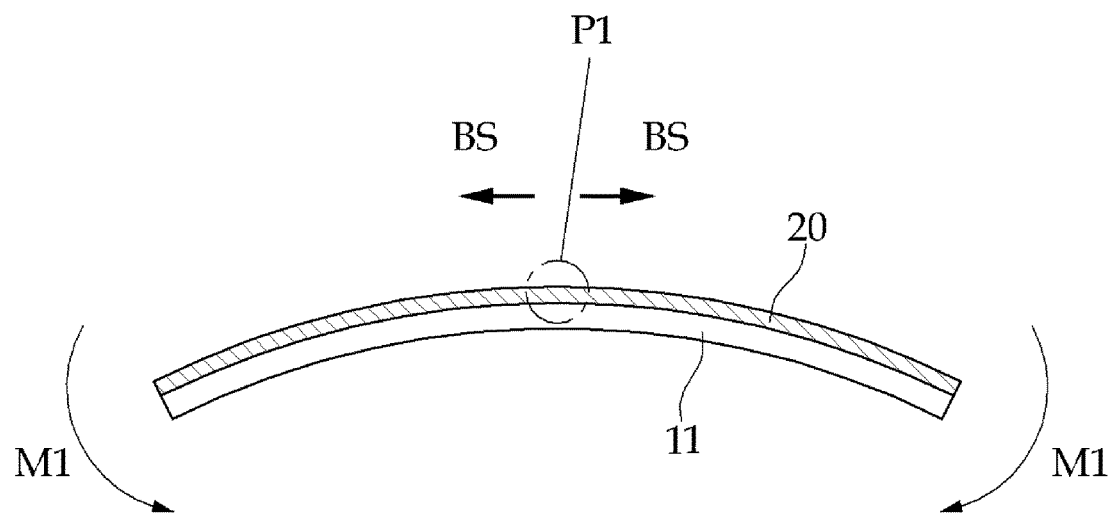
FIG. 4A shows a diagram illustrating a bending moment applied to the anti-scratch film in the related art.
Figure 4B:
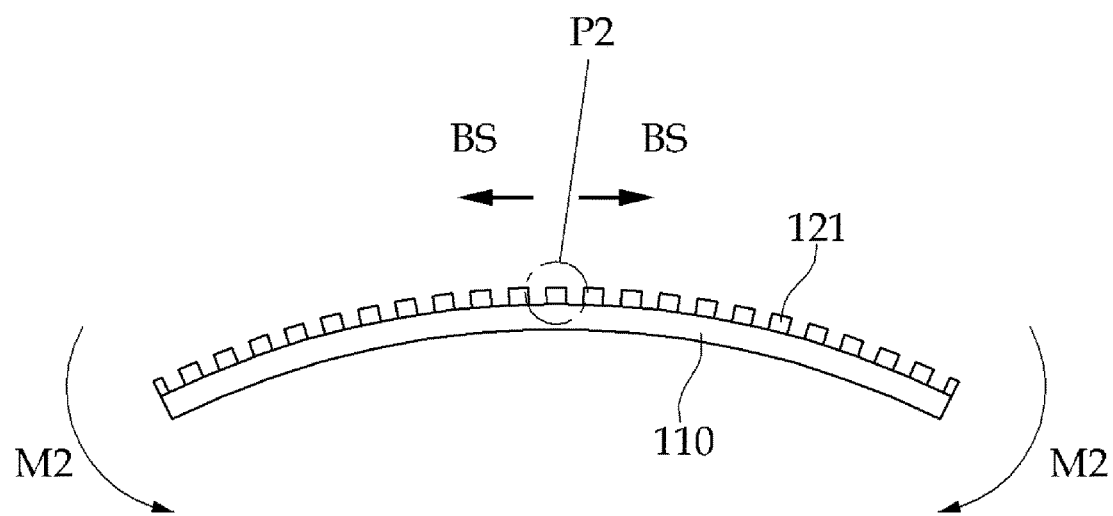
FIG. 4B shows a diagram illustrating a bending moment applied to the anti-scratch film according to an embodiment of the present disclosure.

FIG. 4A shows a diagram illustrating a bending moment M1 applied to the anti-scratch film in the related art, and FIG. 4B shows a diagram illustrating a bending moment M2 applied to the anti-scratch film according to an embodiment of the present disclosure.

As illustrated in FIG. 4A, when the bending moment M1 is applied to the anti-scratch film in the related art, bending stress BS applied to the anti-scratch layer 20 is highest at P1.

Since a bending stress limit of silicon oxide ($SiO_x$) used for the anti-scratch layer 20 is smaller than a bending stress limit of a flexible substrate, when the bending moment M1 reaches or exceeds a certain magnitude, the anti-scratch layer 20 is brittle at P1, where the bending stress BS is concentrated.

However, the anti-scratch film according to the present disclosure has a structure in which bending stress BS applied to P2 of the anti-scratch layer 120 is laterally dispersed, even though the bending moment M2 is applied as illustrated in FIG. 4B, and as a result, the anti-scratch layer 120 is not brittle or is less brittle. That is, since the ratio of the diameter D of each protrusion 121 to the radius of curvature where the anti-scratch layer 120 is bent, is very small, each protrusion 121 may be maintained in an almost flat state.

In FIGS. 2 and 3, the shape of the protrusion 121 is illustrated as a square column, but is not necessarily limited thereto, and the shape of the protrusion 121 may be formed in various suitable shapes such as a lens shape, a pyramid shape, a conical shape, a cylindrical shape, a pyramidal shape having a flat apex, or a conical shape having a flat apex.

The shape of the protrusion 121 may be formed in a shape selected according to a particular use of the anti-scratch film, a bending direction of the display device, and/or a radius of curvature.

Figure 5:
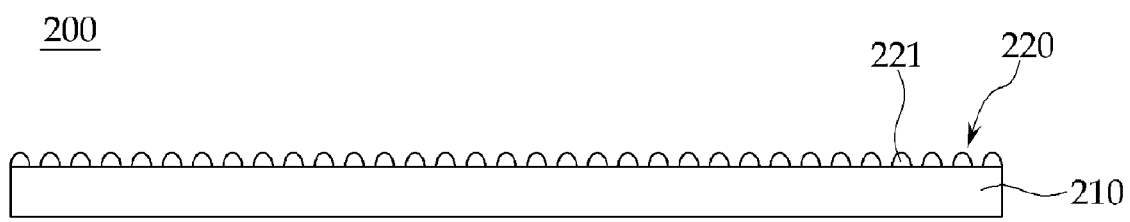
FIG. 5 shows a diagram illustrating an anti-scratch film according to another embodiment of the present disclosure.
Figure 6:
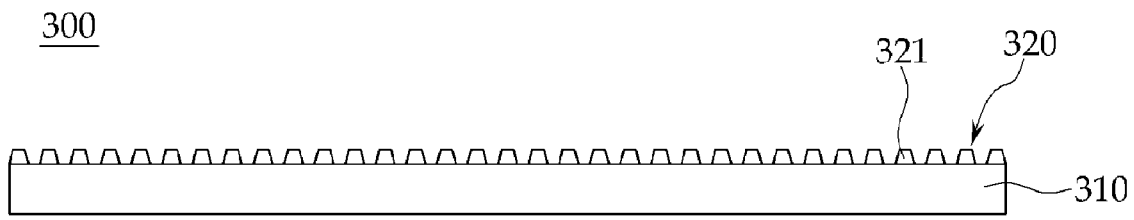
FIG. 6 shows a diagram illustrating an anti-scratch film according to another embodiment of the present disclosure.

FIGS. 5 and 6 are diagrams illustrating an anti-scratch film according to another embodiment of the present disclosure.

As illustrated in FIGS. 5 and 6, the anti-scratch films 200 and 300 include film bases 210 and 310, and anti-scratch layers 220 and 320 on one side of the film base. The anti-scratch layer 220 may include a plurality of protrusions 221 and 321, and the shapes of the protrusions 221 and 321 may be formed in lens shapes (see FIG. 5) or pyramid shapes having flat apexes (see FIG. 6).

Figure 7:
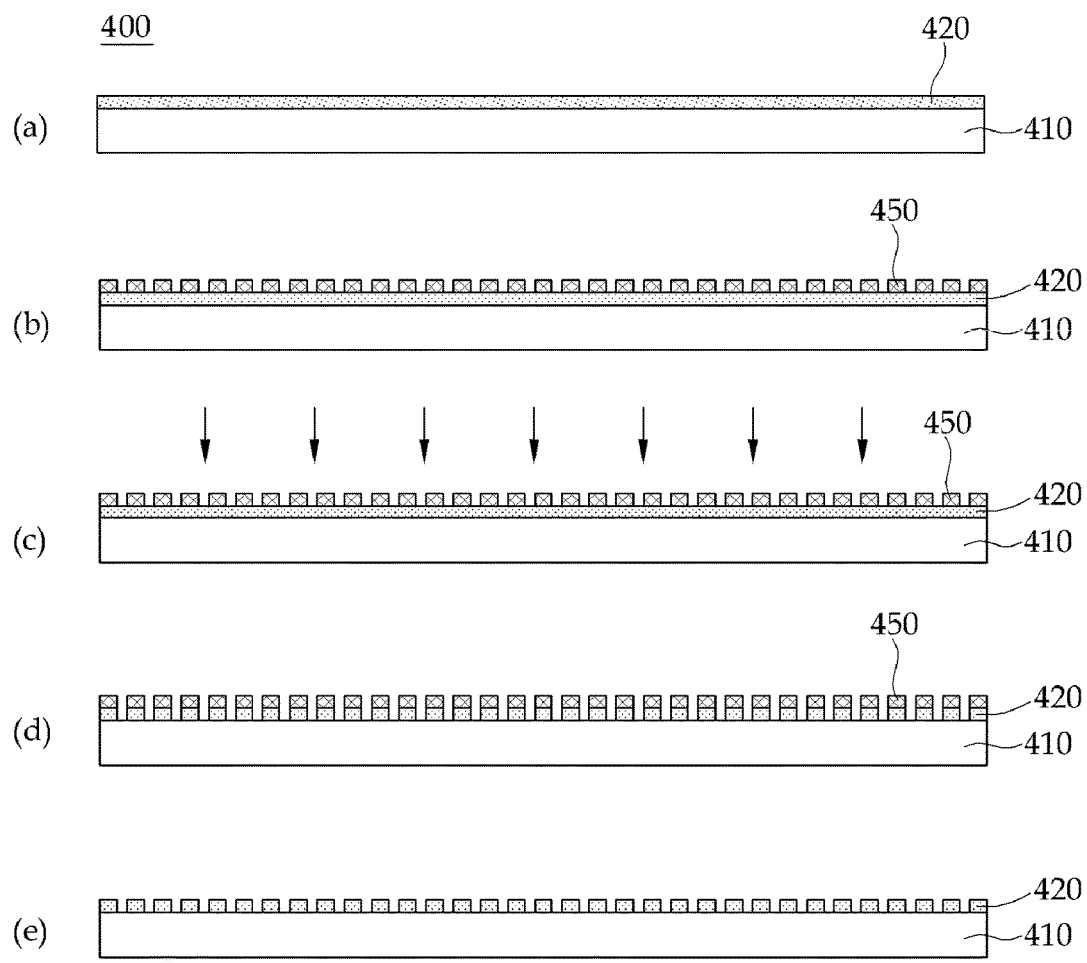
FIG. 7 shows a diagram illustrating a manufacturing method of the anti-scratch film according to an embodiment of the present disclosure.

FIG. 7 is a diagram illustrating a manufacturing method of an anti-scratch film according to an embodiment of the present disclosure.

A manufacturing method of an anti-scratch film 400 according to an embodiment of the present disclosure may include preparing a film base 410 and forming an anti-scratch layer including a plurality of protrusions on one side of the film base 410.

Referring to FIG. 7, the forming of the anti-scratch layer including the plurality of protrusions may include coating a material 420 for forming the protrusions on one side of the film base 410 (see FIG. 7A), forming a photoresist pattern 450 on the material 420 for forming the protrusions (see FIG. 7B), exposing and developing the material 420 for forming the protrusions with the photoresist pattern 450 (see FIG. 7C), etching the material 420 for forming the protrusions with the photoresist pattern 450 (see FIG. 7D), and removing the photoresist pattern 450 (see FIG. 7E).

The coating of the material 420 for forming the protrusions on one side of the film base 410 (see FIG. 7A) may include coating at least one of aluminum oxide ($AlO_2$), aluminum nitride (AlN), aluminum oxynitride (AlON), silicon oxide ($SiO_2$), silicon nitride (SiN), and oxidized silicon nitride (SiON).

A method of coating the material 420 for forming the protrusions may include a spin coating process, a printing process, and/or a sputtering process.

The etching of the material 420 for forming the protrusions with the photoresist pattern 450 (see FIG. 7D) may use a dry etching process and/or a wet etching process.

The forming of the anti-scratch layer 420 including the plurality of protrusions may include forming a mask pattern on one side of the film base 410 and depositing a material for forming the protrusions.

A method of depositing the material for forming the protrusions may use a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, or the like.

Figure 8:
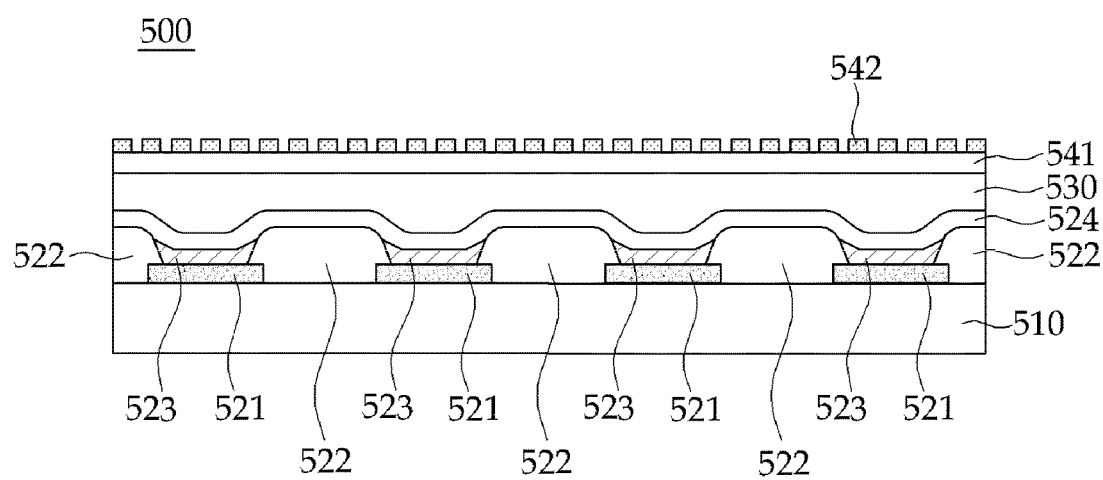
FIG. 8 shows a diagram illustrating a case where the anti-scratch film according to an embodiment of the present disclosure is applied to an organic light emitting display.

FIG. 8 is a diagram illustrating an organic light emitting display including the anti-scratch film according to an embodiment of the present disclosure.

An organic light emitting display 500 including the anti-scratch film may include a substrate 510, an organic light emitting diode on the substrate, an encapsulation layer for sealing the organic light emitting diode, and an anti-scratch film on the encapsulation layer.

The substrate 510 may be made of various suitable materials such as a glass substrate, a quartz substrate, and a transparent resin substrate, and may be formed by using a flexible material. The transparent resin substrate which may be used as the substrate 510 may contain a polyimide resin, an acrylic resin, a polyacrylate resin, a polycarbonate resin, a polyether resin, a polyethylene terephthalate resin, a sulfonic acid resin, or the like.

The organic light emitting diode may include a plurality of first electrodes 521 on the substrate 510, a pixel defining layer 522 formed between the first electrodes 521 and overlapped with ends of the first electrodes 521 to divide the first electrodes 521 by a pixel unit, an organic layer 523 on the first electrode 521 divided by the pixel defining layer 522, and a second electrode 524 on the organic layer 523.

The encapsulation layer may be formed with a multilayered thin film structure where an organic layer and an inorganic layer are alternately laminated in one or more pairs.

The organic layer may include epoxy, acrylate, urethane acrylate, polyurea, polyacrylate, perylene-3,4,9,10-tetracarboxylic-3,4,9,10-dianhydride (PTCDA), 3,3',4,4'-biphenyltetracarboxylic acid dianhydride (BPDA), and/or pyromellitic dianhydride (PMDA).

The inorganic layer may include of silicon nitride, aluminum nitride, zirconium nitride, titanium nitride, hafnium nitride, tantalum nitride, silicon oxide, aluminum oxide, and/or titanium oxide.

In addition, inorganic thin film materials or organic thin film materials which are known in the art may be used as the materials of the inorganic layer and/or the organic layer of the present disclosure, respectively.

The organic layer and the inorganic layer may be formed by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, and/or a vacuum deposition process.

The anti-scratch film may be laminated on the encapsulation layer 530. The anti-scratch film may include a film base 541 and an anti-scratch layer 542 including a plurality of protrusions on the film base 541. As the anti-scratch film, the anti-scratch film according to an embodiment of the present disclosure may be used. An adhesive layer for adhering to the encapsulation layer may be further included at the bottom of the film base 541.

The anti-scratch film may be used in a flexible flat panel display and the like, in addition to the organic light emitting display. The flexible flat panel display may include a liquid crystal display and the like.

As described above, the anti-scratch film including the plurality of protrusions is only exemplified, and those skilled in the art can understand that the scope of the present disclosure may include various modifications and equivalent embodiments therefrom.

From the foregoing, it will be appreciated that various embodiments of the present disclosure have been described herein for purposes of illustration, and that various modifications may be made without departing from the scope and spirit of the present disclosure and the following claims. Accordingly, the various embodiments disclosed herein are not intended to be limiting.

What is claimed is:

1. A display device comprising:
    a substrate;
    a display element layer on the substrate;
    an encapsulation layer on the display element layer; and
    an anti-scratch film on the encapsulation layer,
    wherein the anti-scratch film comprises a film base and a plurality of anti-scratch protrusions directly on one side of the film base, the plurality of anti-scratch protrusions forming an outermost surface of the display device,
    wherein adjacent ones of the plurality of anti-scratch protrusions are spaced from each other such that a portion of the film base is exposed between the adjacent ones of the plurality of anti-scratch protrusions, and
    wherein the anti-scratch protrusions comprise a material different from a material of the film base.

2. The display device of claim 1, wherein each of the plurality of anti-scratch protrusions comprises only a single inorganic material.

3. The display device of claim 2, wherein the inorganic material comprises at least one selected from the group consisting of an oxide, a nitride, and a nitric-oxide.

4. The display device of claim 1, wherein the film base comprises an organic material.

5. The display device of claim 4, wherein the organic material comprises at least one selected from the group consisting of a polyester film, a polyethylene film, a polypropylene film, a tri-acetyl cellulose film, a polyvinyl chloride film, a polyvinyl alcohol film, a polyimide film, a cyclo-olefin resin film, a polycarbonate film, a polyethylene terephthalate film, a polyethylene naphthalate film, a polyether sulfone film, a polyimide film, an epoxy resin film, a phenol resin film, a melamine resin film, a polyurethane film, and/or an acrylic resin film.

6. The display device of claim 1, wherein the plurality of anti-scratch protrusions are arranged in a repeating pattern.

7. The display device of claim 1, wherein the one side of the film base extends in a first direction and a second direction, and
    wherein adjacent ones of the plurality of anti-scratch protrusions are spaced from each other in both the first and second directions.

8. The display device of claim 1, wherein the display element layer comprises:
    a first electrode;
    an active layer on the first electrode; and
    a second electrode on the active layer.

9. The display device of claim 8, wherein the active layer is an organic emission layer.

10. The display device of claim 8, wherein the active layer is a liquid crystal layer.

11. The display device of claim 1, wherein the film base is transparent.

12. The display device of claim 1, further comprising an adhesive layer on another side of the film base.

13. The display device of claim 1, wherein a shape of each of the plurality of anti-scratch protrusions is independently selected from the group consisting of a lens shape, a pyramidal shape, a conical shape, a prismatic shape, and a cylindrical shape.

14. The display device of claim 1, wherein a height of each of the plurality of anti-scratch protrusions is from 0.1 µm to 100 µm.

15. The display device of claim 1, wherein each of the plurality of anti-scratch protrusions has a diameter of from 10 µm to 1mm with a longest radius being on a base side of the anti-scratch protrusion.

16. The display device of claim 1, wherein a distance between adjacent ones of the plurality of anti-scratch protrusions is from 10 µm to 1mm.

* * * * *